United States Patent [19]

Kakimoto

[11] Patent Number: 4,960,730
[45] Date of Patent: Oct. 2, 1990

[54] METHOD OF MAKING A SEMICONDUCTOR LIGHT EMITTING DEVICE USING OUT-DIFFUSION FROM A BURIED STRIPE

[75] Inventor: Syoichi Kakimoto, Itami, Japan

[73] Assignee: Mitsubishi Denki Kabushiki Kaisha, Tokyo, Japan

[21] Appl. No.: 411,748

[22] Filed: Sep. 25, 1989

Related U.S. Application Data

[62] Division of Ser. No. 216,832, Jul. 8, 1988, Pat. No. 4,888,782.

[30] Foreign Application Priority Data

Jul. 16, 1987 [JP] Japan ................................ 62-179346

[51] Int. Cl.$^5$ .................... H01L 21/203; H01L 21/225
[52] U.S. Cl. ............................ 437/129; 148/DIG. 37; 148/DIG. 95; 437/97; 437/133; 437/161; 437/987
[58] Field of Search .................... 148/DIG. 3, 15, 23, 148/30, 37, 35, 56, 65, 72, 97, 95, 110, 169; 156/610-614; 372/45, 46; 357/16, 17, 20, 55; 437/81, 105, 107, 126, 129, 97, 133, 160, 161, 247, 934, 936, 958, 987

[56] References Cited

U.S. PATENT DOCUMENTS

| | | | |
|---|---|---|---|
| 4,329,660 | 5/1982 | Yang et al. | 372/46 |
| 4,511,408 | 4/1985 | Holanyak, Jr. | 437/129 |
| 4,654,090 | 3/1987 | Burnham et al. | 437/174 |
| 4,771,010 | 9/1988 | Epler et al. | 437/19 |
| 4,810,670 | 3/1989 | Furuyama et al. | 437/129 |
| 4,824,798 | 4/1989 | Burnham et al. | 437/81 |
| 4,830,983 | 5/1989 | Thornton | 437/161 |
| 4,843,032 | 6/1989 | Tokuda et al. | 437/129 |

FOREIGN PATENT DOCUMENTS 0074195  6/1980  Japan ................................ 372/46

OTHER PUBLICATIONS

Meehan et al., "Disorder of an AlGaAs-GaAs Superlattice by Donor Diffusion", Appl. Phys. Lett., 45(5), Sep. 1, 1984, pp. 549-551.
Thornton et al., "Highly Efficient, Long Lived AlGaAs Lasers, Fabricated by Silicon Impurity Disordering", Appl. Phys. Lett., 49(3), Jul. 21, 1986, pp. 133-134.
Yonezu et al., "An AlGaAs Window Structure Laser", IEEE Journal of Quantum Electronics, vol. QE-15, No. 8, Aug. 1979.

Primary Examiner—Olik Chaudhuri
Assistant Examiner—William Bunch
Attorney, Agent, or Firm—Leydig, Voit & Mayer

[57] ABSTRACT

A buried stripe semiconductor light emitting device and a method for producing the device in which the buried stripe functions as an internal resonator, and the device has window regions interposed between the resonator and facets on the external surface of the device. A first phase crystal growth is conducted in which a first cladding layer is grown on a doped substrate. Thereafter, a doped stripe of impurities is introduced into the first cladding layer in electrical contact with the doped substrate. The doped stripe extends longitudinally but terminates short of the facets so that later out-diffusion from the doped stripe will form the window regions. A second phase crystal growth is then conducted which buries the doped stripe internal to the semiconductor, i.e., not projecting through any external surface. The second phase crystal growth comprises an active layer, a second cladding layer and a contact layer successively grown on the first cladding layer. Impurities from the buried doped stripe are out-diffused into the active layer to the boundary between the active layer and the second cladding layer to form the resonator, leaving windows interposed between the resonator ends and the facets.

9 Claims, 3 Drawing Sheets

METHOD OF MAKING A SEMICONDUCTOR LIGHT EMITTING DEVICE USING OUT-DIFFUSION FROM A BURIED STRIPE

This is a Division, of application Ser. No. 216,832, filed July 8, 1988, U.S. Pat. No. 4,888,782.

FIELD OF THE INVENTION

This invention relates to semiconductor light emitting devices. More particularly, the invention relates to a window structure semiconductor light emitting device having a high power output, and a method for producing such device.

BACKGROUND OF THE INVENTION

A prior art window structure semiconductor laser is described in "An AlGaAs Window Structure Laser", *IEEE Journal of Quantum Electronics*, Vol. QE-15, No. 8, August, 1979, pp. 775-781. FIG. 3(a) is a plan view of such a device, while FIGS. 3(b) and 3(c) are cross-sectional views taken along lines 3b—3b and 3c—3c of FIG. 3(a), respectively.

As illustrated in FIGS. 3(a)-3(c), a semiconductor light emitting device using the growth techniques of the prior art starts with an n-type GaAs substrate 1. A first cladding layer 2, of n-type $Al_yGa_{1-y}As$ is grown on the n-type GaAs substrate 1. Thereafter, an active layer 3 is grown on the first cladding layer 2 through conventional growth techniques. As is understood in the art, active layer 3 is either of n-type or undoped $Al_xGa_{1-x}As$ ($x<y$). Similar to the first cladding layer 2, a second cladding layer 4 of the same n-type $Al_yGa_{1-y}As$ the first cladding layer 2 is next grown on the active layer 3. The cladding layers 2, 4 have a lower refractive index than the active layer 2, thus confining light generated in the active layer to within that layer. Contact layer 5 is then grown on cladding layer 4 and is of n-type GaAs, completing the growth process of a prior art semiconductor light emitting device. Although not illustrated in FIG. 3, an n side electrode is formed on the substrate 1 and a p side electrode on the contact layer 5 for making electrical connections with the semiconductor device.

In order to create a p-n junction for injecting carriers into a predetermined section of the active layer 3, a first p-type impurity region 6 is diffused from the surface of the contact layer 5 through the second cladding layer 4 to approximately the junction between the second cladding layer 4 and the active layer 3. Thereafter, thermal processing produces a second p-type diffusion region 7 by out-diffusing impurities from the first p-type diffusion region 6 into the active layer 3 to approximately the boundary between the active layer 3 and first cladding layer 2. Thus, there is created a stripe region 8 in the active layer which (a) forms a p-n junction with the adjacent portion of the first cladding layer, and (b) creates a resonator which has a higher index of refraction than the cladding layers or the undoped or n-doped regions of the active layer to confine light within the resonator.

As best shown in FIGS. 3(a) and 3(c), the first and second diffusion regions 6, 7 are positioned longitudinally of the laser, but terminate short of the facets 10, 10' which are located on either longitudinal end surface of the laser. Thus, a pair of windows 9, 9' are created between the stripe region or resonator 8 and the facets 10, 10'. By virtue of the impurity concentration in the resonator 8 (which it is recalled is created by out-diffusion from the stripe region 7), the energy band gap of the resonator 8 is smaller than that of the undoped or n-type doped region of the active layer 3 at the windows 9, 9'. By virtue of this difference in energy gaps, very little of the light generated in the resonator 8 is absorbed in the windows 9, 9', allowing the laser to be operated at higher power.

Although this prior art light emitting device solves the problem of device failure at high operating power by providing windows interposed between the resonator and the laser facets, in contrast to other prior devices where the resonator intersects the facets, it appears to suffer from the problem of inadequate yield because of manufacturing difficulties. More particularly, the location of the out-diffusion region 7, particularly the portion which forms the resonator 8 must be carefully controlled in order to produce useful laser devices. Preferably, the resonator portion 8 of the out-diffusion region 7 penetrates the active layer 3 and terminates at the boundary between the active layer and first cladding layer 2. However, because of the difficulty of controlling the diffusion depth of the first diffusion region 6, and consequently the difficulty of controlling the location of the significantly smaller out-diffusion region 7, it often happens that the resonator portion 8 of the out-diffusion region 7 does not reach the active layer, or alternatively it penetrates the active layer and protrudes into the first cladding layer 2. Both of these situations produce laser devices which are non-functional, thus reducing the yield of the process. When it is appreciated that the cladding layers are on the order of 2 or more microns whereas the active layer is typically about 0.1 microns, the difficulty of process control will be apparent, first of all, in controlling the depth of the first diffusion region to provide an appropriate starting point for the out-diffusion, and subsequently in controlling the out-diffusion to form the resonator. This problem can be further aggravated by surface irregularities on the grown crystal which can be exacerbated by the multiple levels which are grown before the first diffusion region is formed.

SUMMARY OF THE INVENTION

In view of the foregoing, it is an object of the present invention to provide a window structure semiconductor light emitting device capable of being produced at a higher yield than has previously been possible.

More specifically, it is an object of the present invention to provide a method of producing a semiconductor light emitting device such that greater control over the out-diffusion region is possible.

Additionally, it is an object of the present invention to provide a light emitting device and method of producing such a device which is unaffected by variations in thickness of the active layer, second cladding layer and contact layer.

Other objects and advantages of the present invention will become apparent from the detailed description given hereinafter. It should be understood, however, that the detailed description and specific embodiments are given by way of illustration only, since various changes and modifications within the spirit and scope of the invention as defined by the appended claims will become apparent to those skilled in the art from this detailed description.

The foregoing objects are accomplished by the present invention which relates to a buried stripe semiconductor light emitting device and a method for producing the device, in which the buried stripe functions as an internal resonator, and the device has window regions interposed between the resonator and facets on the external surface of the device. A first phase crystal growth is conducted in which a first cladding layer is grown on a doped substrate. Thereafter, a doped stripe of impurities is introduced into the first cladding layer in electrical contact with the doped substrate. The doped stripe extends longitudinally but terminates short of the facets so that later out-diffusion from the doped stripe will form the window regions. A second phase crystal growth is then conducted which buries the doped stripe internal to the semiconductor, i.e., not projecting through any external surface. The second phase crystal growth comprises an active layer, a second cladding layer and a contact layer successively grown on the first cladding layer. Impurities from the buried doped stripe are out-diffused into the active layer to the boundary between the active layer and the second cladding layer to form the resonator, leaving windows interposed between the resonator ends and the facets.

DETAILED DESCRIPTION OF THE PREFERRED EMBODIMENTS

Figure 1A:
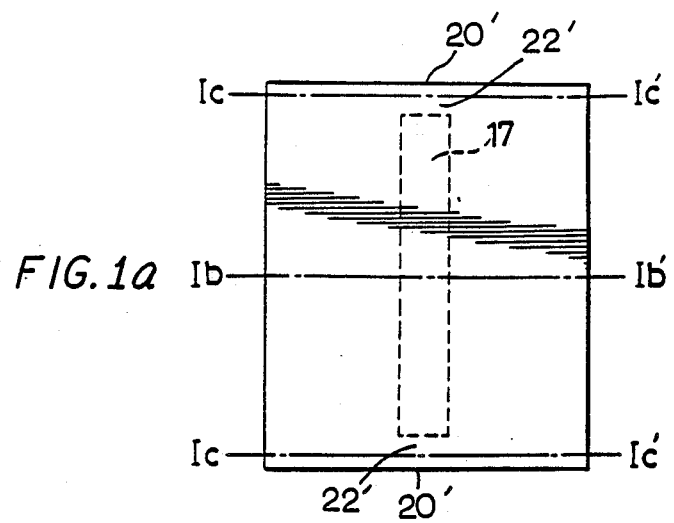
FIGS. 1(a), 1(b) and 1(c) are diagrams showing a plan view and cross-sectional views of a semiconductor light emitting device according to the present invention.

Turning now to the drawings, FIGS. 1 and 2 illustrate a semiconductor light emitting device exemplifying the present invention and the method by which it is manufactured. In contrast to the prior art where all of the cladding, active and contact layers are grown on the substrate in a single crystal growth operation, in accordance with the present invention the crystal growth is divided into a first and second phase, with an operation intermediate the two phases which deposits a doped stripe of impurities in close proximity to the location to be occupied by the active layer, such that out-diffusion of impurities from the doped stripe can be accurately controlled.

Figure 2A:
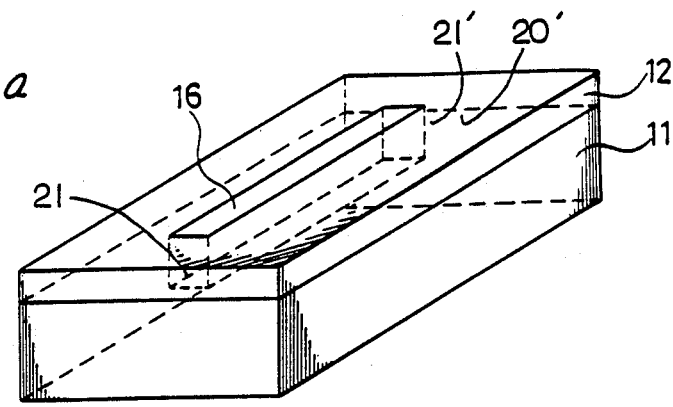
FIGS. 2(a) and 2(b) are perspective views illustrating phases of a process for producing a window structure buried stripe semiconductor light emitting device according to the present invention.

Referring more particularly to FIG. 2(a), there is shown a substrate 11, in the illustrated embodiment p-type GaAs. A first cladding layer 12 comprising n-type $Al_yGa_{1-y}As$ is grown on the substrate 11 in a first phase growth process, preferably by liquid phase epitaxy.

Figure 2B:
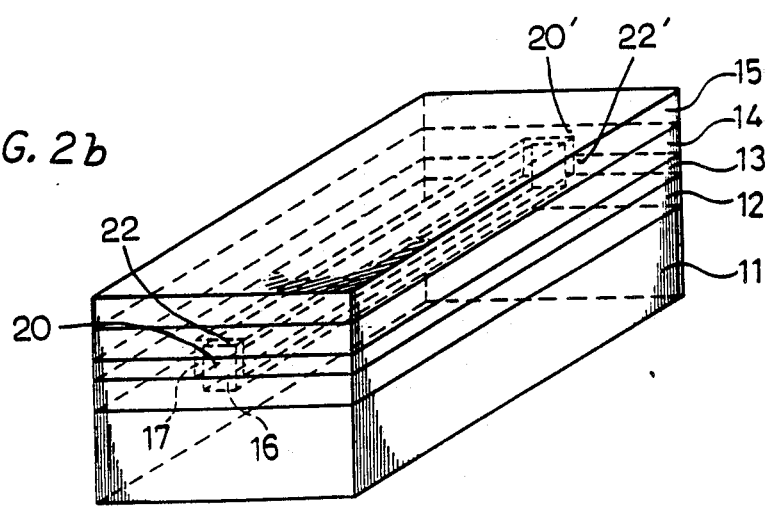
Figure 3A:
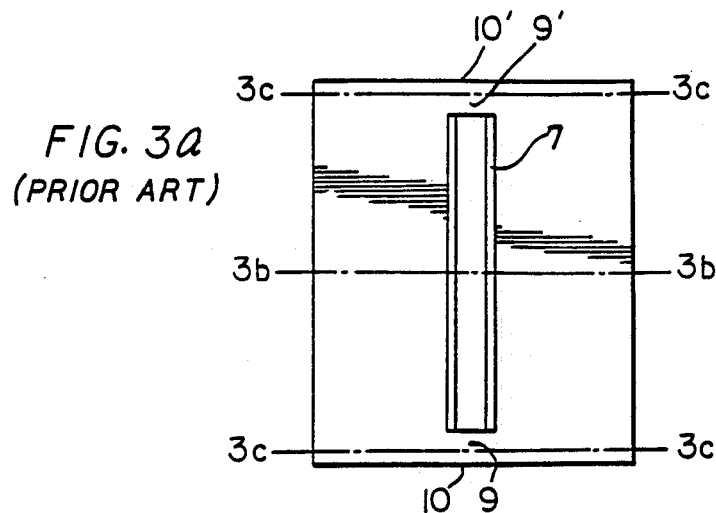
FIGS. 3(a), 3(b) and 3(c) are a plan view and cross-sectional views showing a semiconductor light emitting device according to the prior art.
Figure 3B:
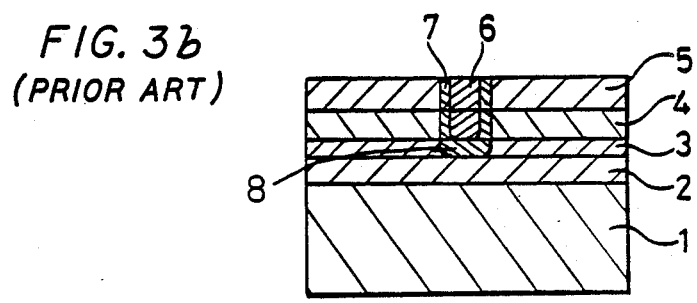
Figure 3C:
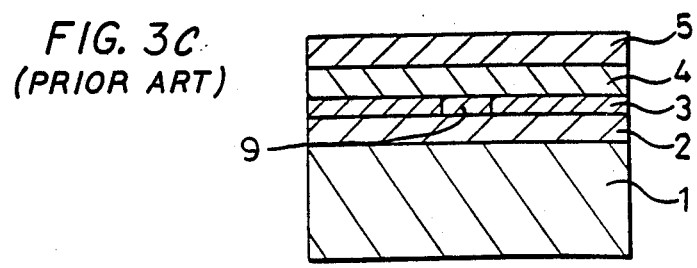

In contrast with conventional techniques where an active layer would then be grown on the first cladding layer, in accordance with the invention, the first phase growth process is terminated and a doped stripe of impurities 16 is introduced into the first cladding layer. As shown in FIGS. 2(a) and 2(b), the doped stripe 16 is internal to the semiconductor in that when the additional layers are grown on the semiconductor the doped stripe does not project through any external surface of the semiconductor. Importantly, the doped stripe 16, which runs longitudinally of the semiconductor toward opposed facets 20, 20' has gaps 21, 21' interposed between the ends of the buried stripe 16 and the facets 20, 20'.

The doped stripe 16 is preferably introduced by diffusion techniques, such as the closed tube diffusion process. A suitable mask, such as $Si_3Ni$ is disposed on the first cladding layer 12 to cover all but the internal stripe region 16, and impurities are diffused into the stripe region 16. In one typical embodiment, the closed tube diffusion process is run with a reduced pressure of about $10^{-7}$ torr. Using Zn as the source of p-type impurities and a source of As to prevent out-diffusion from the GaAs, diffusion is conducted for a period of approximately 6 to 7 hours. The diffusion should be conducted until the impurities penetrate the first cladding layer to form an electrical contact with the p-type substrate.

It will also be clear that other techniques can be used to form the internal doped stripe 16. For example, the stripe can be formed using conventional ion implantation techniques in place of the diffusion process described above.

In practicing the invention, having disposed a source of doped impurities in the first cladding layer, a second phase crystal growth process is conducted, thereby burying the doped stripe 16, i.e., the doped stripe 16 is completely confined within the semiconductor device, and does not project through any surface thereof. The second phase crystal growth, preferably liquid phase epitaxy, begins with the growth of the active layer over the first cladding layer, including growing of the active layer over the doped stripe. The active layer is preferably n-type $Al_xGa_{1-x}As$ (x<y), but can be undoped $Al_xGa_{1-x}As$. In contrast to the cladding layer which can be on the order of about 2 microns, the active layer is thin, preferably on the order of about 0.1 microns. Following growth of the active layer, a second cladding layer 14 is grown, similar in thickness to the first cladding layer, and comprising n-type $Al_yGa_{1-y}As$. Finally, the second phase crystal growth is completed by growing a contact layer 15 comprising n-type GaAs is grown on the second cladding layer 14. Although not illustrated in the drawings, a p-side electrode is disposed on the substrate 11 and an n-side electrode on the contact layer 15 for forming electrical connections with the semiconductor device.

Figure 1B:
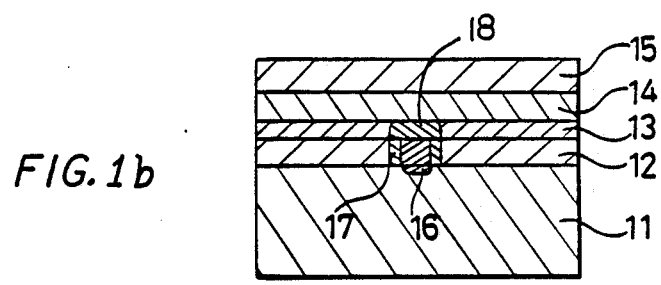
Figure 1C:
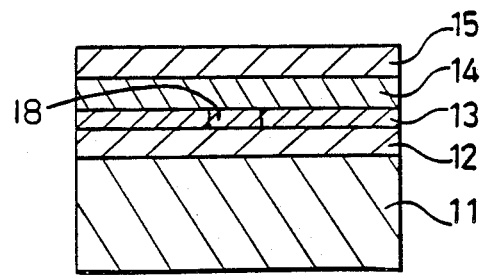

In practicing the invention, some of the impurities which are originally deposited in the dope stripe 16 are out-diffused as illustrated at 17 in the drawings (FIGS. 1(b) and 2(b)). As best seen in FIG. 1(b), the out-diffused region 17 includes a buried stripe 18 which is out-diffused into the adjacent active layer 13. Diffusion conditions are controlled such that the out-diffused portion 18 penetrates the active layer and terminates approximately at the boundary between the active layer 13 and the second cladding layer 14. When it is appreciated that the active layer is only about 0.1 microns in thickness, and that the first diffusion region 16 is positioned immediately adjacent the active layer, the control in the location of the second diffusion region which is achieved by the invention will become apparent.

In the preferred practice of the invention, the out-diffusion region 17 is created during the second phase crystal growth process. In order to accomplish that, the time and temperature of the growth conditions are regulated to match the mobility of the diffused impurities, such that once the active layer 13 is deposited at the beginning of the second phase crystal growth, during the remainder of the second phase crystal growth, out-diffusion of impurities from the first stripe 16 will just reach the boundary between the active layer 13 and the second cladding layer 14 at the termination of the second phase crystal growth. Thus, in the preferred practice of the invention, no further annealing step is required, and the wafer can be cleaved at its facets to form individual semiconductor lasers immediately after the n and p electrodes are disposed on the semiconductor as described above.

In a particular embodiment of the invention, where the impurity density within the buried stripe 16 is on the order of $10^{20}$ cm$^{-3}$, the second phase crystal growth process is conducted at an average temperature of about 700° C. for approximately 30 minutes in order to out-diffuse the buried stripe 18 to approximately the boundary between the active layer 13 and the second cladding layer 14. The out-diffused stripe in this embodiment can have an impurity concentration of about $10^{18}$ cm$^{-3}$. It is well known that crystal growth techniques include a sharp increase in temperature of the apparatus to a temperature somewhat in excess of the average growing temperature, a stabilization period during which the wafer stabilizes in temperature, then a growth process during which the temperature is slowly decreased for a period of time during which the additional layers are grown. The 30 minutes specified herein is approximately the time from the completion of the growth of the active layer to the termination of crystal growth following the growth of the contact layer 15. It will be apparent that the times, temperatures and impurity concentrations can be varied within limits by those skilled in this art in order to achieve the specified result of growing the stripe region through the active layer to the boundary between the active and second cladding layers.

By virtue of the positioning of the doped layer 16 and the control of out-diffusion into the region 17, a semiconductor light emitting device or laser is formed which is highly efficient on the one hand and also capable of high power operation on the other. The buried stripe 18 is encompassed entirely within the semiconductor and is surrounded by regions of lower refractive index. More particularly, the first and second cladding layers which sandwich the active layer have lower refractive indices than the active layer and the portions of the active layer bracketing the striped region 18 also have higher indices of refraction whereby the stripe region 18 in the active layer functions as a resonator to guide light generated in the stripe 18 toward the facets 20, 20'. It is recalled that the stripe 16 has interposed portions 21, 21' between the facets 20, 20' and the stripe. During the out-diffusion process, those gaps form windows 22, 22' (see FIGS. 1(a) and 1(c)) in the active layer 13 intermediate the buried stripe 18 and the facets 20, 20'. Because the windows 22, 22' are either undoped or n-doped AlGaAs, which has a relatively large band gap, whereas the doped stripe 18 has a relatively high (e.g., $10^{18}$ cm$^{-3}$) concentration of p-type impurities, and thereby has a comparatively low band gap, substantially all of the light produced within the buried stripe 18 will pass through the windows 22, 22' without suffering the recombination typical of laser devices having no window structure. More particularly, in prior art laser devices without window structures, there exists a substantial number of non-radiative recombination centers near the facets which can absorb photons which would otherwise be emitted, thereby creating additional heat, lowering the energy band gap near the facets, exacerbating the recombination problem and ultimately destroying the device. By virtue of the window structure 22, 22' which has a substantially higher energy gap than that of the stripe 18, the recombination problem is substantially eliminated and the device can be operated at high power for long periods of time without risk of failure.

While in the above illustrated embodiment a GaAs/AlGaAs series semiconductor light emitting device is described, it will be appreciated that the present invention may be applied to a device or method of producing a semiconductor light emitting device of any series material such as InP/InGaAsP series material.

It will now be apparent that what has been provided is a high power light emitting device such as a laser which is capable of being produced at high yield. A buried stripe in the active region is produced by out-diffusion, but the out-diffusion source is deposited in the cladding layer immediately adjacent the active layer into which it is to be out-diffused. Thus, not only are windows provided interposed between the buried stripe and the laser facets, but by virtue of depositing the doped impurities immediately adjacent the active layer into which they are to grow, the growth can be controlled so that impurities are out-diffused into the active layer but only to the boundary between the active layer and the second cladding layer. Thus, since the position of the p-n junction between the buried stripe and the second cladding layer is reliably controlled, the yield is substantially greater than has been possible using prior art techniques in which a first diffusion must be accomplished through comparatively thicker contact and cladding layers before out-diffusion into the active layer can begin.

What is claimed is:

1. A method of producing a buried stripe semiconductor light emitting device in which the buried stripe functions as an internal resonator, and window regions are interposed between end surfaces of the resonator and facets on the external surface of the light emitting device, the method comprising the steps of:

conducting a first phase crystal growth in which a first cladding layer is grown on a doped substrate;

introducing a doped stripe of impurities into the first cladding layer in electrical contact with the doped substrate, the doped stripe extending longitudinally but terminating short of the facet for forming said window regions;

conducting a second phase crystal growth to bury the doped stripe internal of the semiconductor light emitting device, the second phase crystal growth including growing an active layer, a second cladding layer and a contact layer successively over the first cladding layer; and out-diffusing impurities from the doped stripe into the active layer to the boundary between the active layer and the second cladding layer to form the resonator, the out-diffused impurities forming an internal semiconductor junction between the resonator and second cladding layer having undoped window regions in the active layer intermediate the resonator and the facets.

2. A method of producing a buried stripe semiconductor light emitting device as defined in claim 1 wherein said doped stripe of impurities is introduced by diffusion.

3. A method of producing a buried stripe semiconductor light emitting device as defined in claim 1 wherein said doped stripe of impurities is introduced by ion injection.

4. A method of producing a buried stripe semiconductor light emitting device as defined in claim 1 wherein the step of conducting the second phase crystal growth is performed at the same time as the step of out-diffusing impurities from said doped stripe.

5. A method of producing a buried striped semiconductor light emitting device as defined in claim 4 wherein the step of conducting the second phase crystal growth is accomplished at an average temperature of about 700° C. for approximately 30 minutes.

6. A method of producing a buried stripe semiconductor light emitting device as defined in claim 1 wherein said semiconductor substrate and said doped stripe of impurities are of a first conductivity type, and said first cladding layer, said second cladding layer and said contact layer are of a second conductivity type, whereby a p-n junction is formed between the resonator and the second cladding layer.

7. A method of producing a buried stripe semiconductor light emitting device as defined in claim 6 wherein said active layer is grown from a second conductivity type material.

8. A method of producing a buried stripe semiconductor light emitting device as defined in claim 6 wherein said active layer is grown from an undoped material.

9. A method of producing a buried stripe semiconductor light emitting device as defined in claim 1 wherein Zn impurities are diffused into the first cladding layer to form the doped stripe, the doped stripe has an impurity concentration of approximately $10^{20}$ cm$^{-3}$, and the out-diffused impurity concentration in the resonatory is approximately $10^{18}$ cm$^{-3}$.

* * * * *